Nov. 24, 1964 R. TAYLOR 3,158,760

PHASE SHIFT SEMICONDUCTOR APPARATUS

Filed Jan. 25, 1963

INVENTOR.
RICHARD TAYLOR

BY John J. Goodwin

ATTORNEY

United States Patent Office 3,158,760
Patented Nov. 24, 1964

3,158,760
PHASE SHIFT SEMICONDUCTOR APPARATUS
Richard Taylor, Yorktown Heights, N.Y., assignor to International Business Machines Corporation, New York, N.Y., a corporation of New York
Filed Jan. 25, 1963, Ser. No. 253,963
6 Claims. (Cl. 307—88.5)

The present invention relates to semiconductor circuits, and more particularly to a chargistor phase shift device for use as a phase shift oscillator and delay element.

The device referred to herein as a "chargistor" has been described in copending application Serial Number 143,132 filed October 5, 1961, and assigned to the assignee of this invention. The chargistor includes a body composed of a substantially intrinsic material to which opposite conductivity contacts are made at either end, and the structure thus formed is biased to provide what is referred to in the art as the injected plasma conduction case. In the injected plasma conduction case both type of charge carriers, that is, holes and electrons, are injected into the intrinsic material in equal numbers from the opposite conductivity contacts. When one or more control or gate electrodes are connected to the intrinsic semiconductor body, significant conductivity modulation may be accomplished.

More particularly, the chargistor is constituted of a bar of intrinsic semiconductor material such as high resistivity n-type germanium to which injecting contacts are made. A p-type charge is alloyed to one end of the intrinsic body and an n-type feeder is alloyed to the other end. The gate electrodes are alloyed to the intrinsic body intermediate the feeder and charger. When the charger is biased positively, with respect to the feeder, conduction through the bar of intrinsic material will occur due to the injection of holes from the p-type charger and electrons from the n-type feeder. The conduction is limited by space charge. The space charge regions exist because the holes and electrons recombine in the intrinsic body. The potential and space charge distribution in the body are changed however, by the action of the gate electrodes which improve the conductivity and current flow in the intrinsic bar.

In the present invention, the pentode chargistor described in the aforesaid copending application Serial Number 143,132, is employed with additional circuitry to provide, in one embodiment, a phase shift oscillator and in another embodiment, a delay device.

An object of the present invention is to provide an improved semiconductor phase shift device for use as an oscillator or delay element.

Another object of the present invention is to provide a semiconductor phase shift oscillator exhibiting at least unity voltage and power gain.

A further object of the present invention is to provide a semiconductor phase shift oscillator having a zero phase shift at a given frequency without the use of external phase shift networks.

Another object of the present invention is to provide an improved semiconductor delay element.

The foregoing and other objects, features and advantages of the invention will be apparent from the following more particular description of preferred embodiments of the invention, as illustrated in the accompanying drawings.

Figure 1:
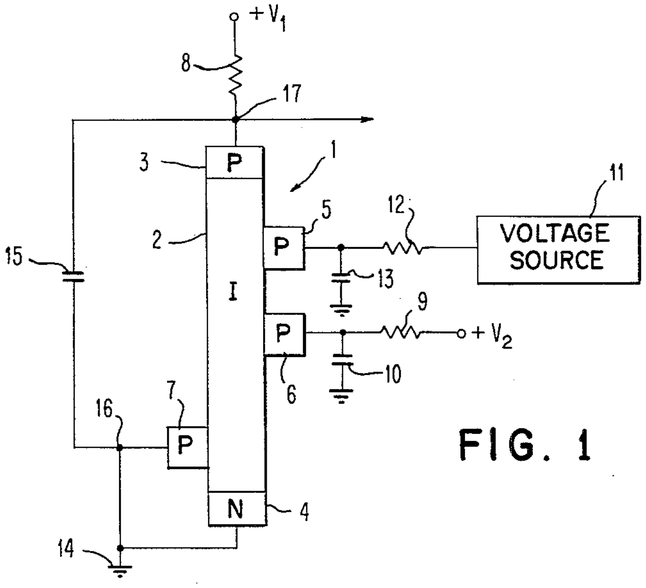
FIG. 1 is a schematic diagram of an embodiment of a semiconductor phase shift device connected as an oscillator.

Referring to FIG. 1, a semiconductor phase shift device is shown connected to provide a phase shift oscillator. The semi-conductor element 1 is a pentode chargistor as described in copending application Serial Number 143,132 previously mentioned. Semiconductor element 1 includes a slab of intrinsic semiconductor material 2 with a p-type contact 3 of suitable material, for example indium, alloyed to the upper end and an n-type contact 4 of suitable material, for example, lead-in-arsenic, alloyed to the lower end. Three additional p-type contacts 5, 6 and 7 are alloyed to the surface of intrinsic body 2. Hereinafter, contact 3 will be referred to as the charger contact, contact 4 will be referred to as the feeder contact, and contacts 5, 6 and 7 will be referred to as gate contacts. A source of bias voltage $+V_1$ is applied to charger contact 3 via resistor 8 and a bias voltage $+V_2$ is applied to gate contact 6 via a coupling circuit including resistor 9 and capacitor 10. A variable voltage source 11 is connected to gate 5 via a coupling circuit including resistor 12 and capacitor 13 and feeder contact 4 is connected to reference (ground) potential 14.

With the circuit described thus far, conduction will occur in the semiconductor device; holes will be injected from the charger contact 3 and electrons will be injected from feeder contact 4 into the intrinsic body 2. The bias voltage applied to gate contacts 5 and 6 will reduce the space charge and double injection conduction occurs.

A feedback path including capacitor 15 is connected between charger contact 3 and gate contact 7, thus, a portion of the charger output signal is coupled back as an input signal to gate contact 7.

It has been found that at given bias conditions the chargistor 1 will produce a 360 degree phase shift of signals applied to gate contact 7. Signals applied to the input terminal 16 of gate contact 7 will produce output signals at charger terminal 17 which are of phase shifted 360 degrees with respect to the signal at terminal 16. When the signals at terminal 17 are fed back as input signals to terminal 16, oscillations will be produced since the circuit is effectively a phase shift oscillator. The advantage the circuit of FIG. 1 has over conventional electron tube or transistor phase shift oscillators is that there is no need for external RC or LC networks in the feedband path since the desired 360 degree phase shift occurs entirely in the semiconductor element 1, and also it has been found that the circuit operates with voltage and power gains of unity or greater.

With a chargistor element constructed as previously described, representative circuit elements may be employed having the following values.

| | | |
|---|---|---|
| $V_1$ | volts | +30.0 |
| $V_2$ | do | +5.6 |
| Source 11 | do | +8.0 |
| Resistor 8 | ohms | 4.7K. |
| Resistor 9 | do | 30.0 |
| Resistor 12 | do | 30.0 |
| Capacitor 10 | μfarads | 25.0 |
| Capacitor 13 | do | 25.0 |
| Capacitor 15 | do | 160.0 |

With circuit parameters having values as set forth above, the circuit of FIG. 1 produced a sinusoidal output signal at terminal 17 oscillating at a frequency of 80 kilocycles per second. A 360 degree phase shift was present between terminals 16 and 17 with a unity voltage gain (therefore unity or greater power gain).

The circuit of FIG. 1 described thus far may be employed as a stable phase shift oscillator requiring no external LC or RC networks and providing at least unity voltage and power gain. It is also possible to vary the frequency of the output signal at terminal 17 by varying the bias voltage applied to gate contact 5. The frequency of the output signal at terminal 17 can be varied between 10 kilocycles per second and 100 kilocycles per second by varying the voltage applied to gate contact 5 from voltage source 11 between approximately 7.75 volts and 8.25 volts. The circuit of FIG. 1 may also be utilized as a frequency modulator by varying the voltage applied to gate 5 by source 11 sinusoidally at a given rate. For example, of the voltage from source 11 varied between 7.75 and 8.25 volts at a frequency of 50 kilocycles per second, the output signal at terminal 17 would be a frequency modulated signal varying between 10 kilocycles per second and 100 kilocycles per second at a 50 kilocycle per second carrier frequency.

Figure 2:
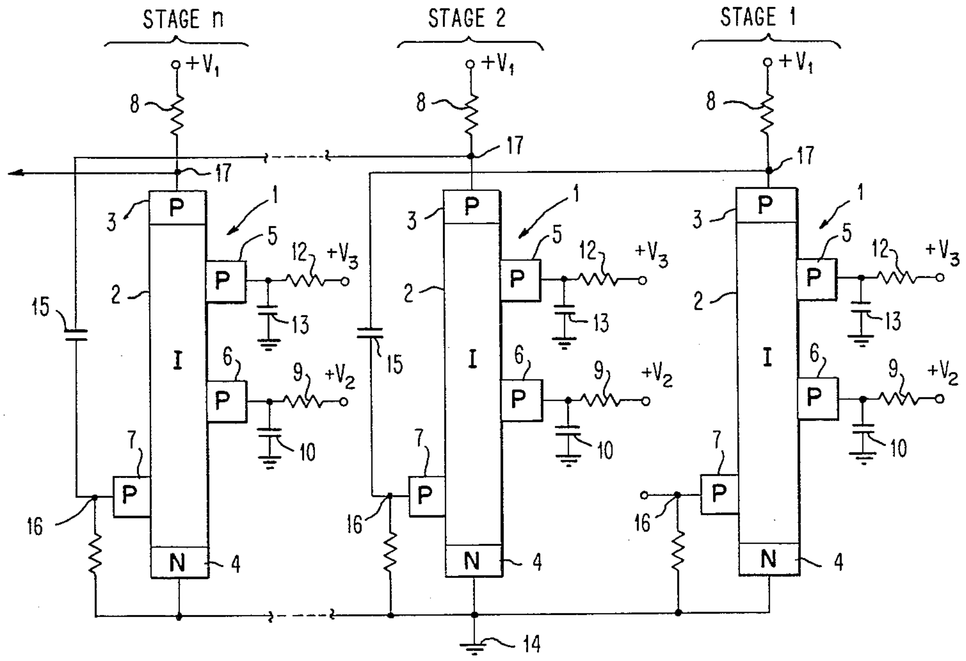
FIG. 2 is a schematic diagram of an embodiment of a semiconductor phase shift device connected as a delay apparatus.

Another embodiment of the present invention is shown in FIG. 2. In this embodiment a plurality of semiconductor chargistor devices 1 similar to that described in FIG. 1 are connected in series arrangement. The output signal at terminal 17 of each chargistor is fed back through a capacitor 15 to the gate contact 7 of the next succeeding chargistor rather than its own gate contact as shown in FIG. 1. The distinction in FIG. 2 is that each chargistor, not having regenerative feedback, will not oscillate. However, with the bias voltage conditions previously described ($+V_3$ replacing voltage source 11 and maintained at +8.0 volts) there will be a 360 degree phase shift between each chargistor. Thus, there will be a one cycle delay between each of the stages 1, 2 . . . *n*. A signal applied to gate contact 7 of stage 1 will produce an output signal at terminal 17 (of stage 1) delayed one cycle in time. The output signal from terminal 17 (stage 1) is then applied to gate contact 7 of stage 2 which will in turn produce an output signal at terminal 17 (stage 2) delayed one cycle in time with respect to the input signal at gate contact 7 (stage 2) and two cycles in time with respect to the input signal at gate 7 (stage 1). In like manner a one cycle time delay will be produced by each succeeding stage for a total delayed output signal from terminal 17 (stage *n*) of *n* cycles in time with respect to the original input signal at gate contact 7 (stage 1). It is also to be understood that by changing the value of bias voltage applied to gate contacts 5 or 6, a delay of less than 360 degrees may also be provided.

What has been described is a semiconductor chargistor phase shift device which may be utilized as a phase shift oscillator having the advantage of stable operation with at least unity voltage and power gain without employing RC or LC feedback networks, or may also be utilized as a frequency modulator. With minor changes in circuit connections a plurality of such semiconductor phase shift devices may be connected to provide a delay element which provides time delay without power loss.

While the invention has been particularly shown and described with reference to preferred embodiments thereof, it will be understood by those skilled in the art that various changes in form and details may be made therein without departing from the spirit and scope of the invention.

What is claimed is:

1. A semiconductor phase shift device comprising:
a seminconductor element including a body of substantially intrinsic semiconductor material, a pair of opposite conductivity type contacts, one of said pair of contacts located at each end of said body for producing injection of holes and electrons respectively into said body, and at least two predetermined conductivity electrodes in contact with said body between said end contacts,
a first source of potential coupled to one of said end contacts,
a second source of potential connected to one of said electrodes,
and a feedback circuit connected between said one of said end contacts and the other one of said electrodes for producting an oscillating output signal from said one of said end contacts.

2. A semiconductor phase shift device comprising:
a semiconductor element including a body of substantially intrinsic semiconductor material, a pair of opposite conductivity type contacts, one of said pair of contacts located at each end of said body for producing injection of holes and electrons respectively into said body, and three predetermined conductivity gate electrodes in contact with said body between said end contacts,
a first source of potential coupled to one of said end contacts,
a second source of potential coupled to a first one of said gate electrodes,
a third source of potential coupled to a second one of said gate electrodes,
and a feedback circuit connected between said one of said end contacts and a third one of said gate electrodes for producing an oscillating output signal from said one of said end contacts,
said first, second and third sources of potential providing potential levels to said associated end contact and first and second gate electrodes to provide a 360 degree phase shift between said one of said end contacts and said third gate electrode.

3. A semiconductor phase shift device comprising:
a semiconductor element including a body of substantially intrinsic semiconductor material, a pair of opposite conductivity type contacts, one of said pair of contacts located at each end of said body for producing injection of holes and electrons respectively into said body, and three predetermined conductivity gate electrodes in contact with said body between said end contacts,
a first source of potential coupled to one of said end contacts,
a source of variable voltage coupled to a first one of said gate electrodes,
a second source of potential, coupled to a second one of said gate electrodes,
and a capacitive feedback circuit connected between said one of said end contacts and a third one of said gate electrodes for producing an output signal from said one of said end contacts having a frequency representative of the level of said variable voltage.

4. A semiconductor phase shift device comprising:
a semiconductor element including a body of substantially intrinsic semiconductor material, a pair of opposite conductivity type contacts, one of said pair of contacts located at each end of said body for producing injection of holes and electrons respectively into said body, and three predetermined conductivity gate electrodes in contact with said body between said end contacts,
a first source of potential coupled to one of said end contacts,
a source of alternating-current voltage having a given frequency coupled to a first one of said gate electrodes,
a second source of potential coupled to a second one of said gate electrodes,
and a capacitor connected between said one of said end contacts and a third one of said gate electrodes for producing an output signal from said one of said end contacts having a first frequency modulated on said frequency of said given frequency of said alternating-current voltage.

5. A semiconductor phase shift device comprising:
a semiconductor element including a body of substantially intrinsic semicondcutor material, a p-type contact connected to one end of said body, an n-type contact connected to the other end of said body, and three p-type gate electrodes in contact with said body between said p-type and n-type contacts,
a first source of positive potential coupled to said p-type contact,
a second source of positive potential coupled to a first one of said gate electrodes, a third source of positive potential coupled to a second one of said gate electrodes, and a capacitor coupled between said p-type contact and a third one of said gate electrodes for producing an oscillating output signal from said p-type contact.

6. A semiconductor phase shift device comprising:

a plurality of semiconductor elements, each element including a body of substantially intrinsic semiconductor material, a pair of opposite conductivity type contacts, one of said pair of contacts located at each end of each body for producing injection of holes and electrons respectively into said bodies, and three predetermined conductivity gate electrodes in contact with each body between said end contacts, a plurality of sources of first potential, each coupled to first ones of said gate electrodes, a plurality of sources of second potential, each coupled to second ones of said gate electrodes, and means connecting one of said end contacts of each semiconductor element to the third one of said gate electrodes of each successive semiconductor element for providing a serial circuit arrangement of said semiconductor elements wherein each semiconductor element produces a predetermined time delay.

No references cited.